United States Patent
Mugica Odriozola et al.

(10) Patent No.: US 10,337,741 B2
(45) Date of Patent: Jul. 2, 2019

(54) ILLUMINATION SYSTEM OF A COOKING APPLIANCE

(71) Applicant: Copreci, S. Coop., Aretxabaleta (ES)

(72) Inventors: José Ignacio Mugica Odriozola, Bergara (ES); Jesús Ignacio Errasti Badiola, Gasteiz (ES); Iñigo Peñagaricano Badiola, Urretxu (ES)

(73) Assignee: COPRECI, S. COOP., Aretxabaleta (ES)

( * ) Notice: Subject to any disclaimer, the term of this patent is extended or adjusted under 35 U.S.C. 154(b) by 0 days.

(21) Appl. No.: 16/137,824

(22) Filed: Sep. 21, 2018

(65) Prior Publication Data
US 2019/0093899 A1 Mar. 28, 2019

(30) Foreign Application Priority Data
Sep. 27, 2017 (EP) .................................... 17382640

(51) Int. Cl.
*H05B 37/02* (2006.01)
*F24C 7/08* (2006.01)
(Continued)

(52) U.S. Cl.
CPC ............ *F24C 7/082* (2013.01); *F21V 23/003* (2013.01); *F21V 23/04* (2013.01); *G05G 1/105* (2013.01);
(Continued)

(58) Field of Classification Search
CPC ....... F21V 23/003; F21V 23/04; H01H 9/161; H01H 19/025; H01H 19/14; H01H 2009/164; H01H 2231/012; H05K 1/14; H05K 2201/09027; H05K 2201/10356; G05G 1/10; G05G 1/105
(Continued)

(56) References Cited

U.S. PATENT DOCUMENTS 6,111,231 A * 8/2000 Corson ................ H05B 1/0266
219/412
6,294,906 B1 9/2001 Kuechler
6,733,146 B1 5/2004 Vastano

FOREIGN PATENT DOCUMENTS

GB 645725 A 11/1950
WO 2017020963 A1 2/2017

OTHER PUBLICATIONS

Extended European Search Report in corresponding European Application No. 17382640.5, dated Apr. 4, 2018.

* cited by examiner

*Primary Examiner* — Tung X Le
*Assistant Examiner* — Henry Luong
(74) *Attorney, Agent, or Firm* — Edell, Shapiro & Finnan, LLC

(57) ABSTRACT

Provided is an illumination system of a cooking appliance that includes at least one burner and an associated knob. The system comprises an electric circuit associated with the knob, with a display device in a second electrical branch that lights up when an electric current with a minimum value circulates through the second electrical branch. Activation means in a first electrical branch is operated by means of turning the knob. Both the first and second electrical branches are connected in parallel. Acting on the knob causes a change in voltage drop in the first and second electrical branches, and the illumination system is configured to control the electric current circulating through the display device depending on said voltage drop.

20 Claims, 10 Drawing Sheets

(51) Int. Cl.
*H05K 1/14* (2006.01)
*F21V 23/04* (2006.01)
*F21V 23/00* (2015.01)
*H01H 19/14* (2006.01)
*H01H 19/02* (2006.01)
*G05G 1/10* (2006.01)
*H01H 9/16* (2006.01)

(52) U.S. Cl.
CPC .......... *H01H 19/025* (2013.01); *H01H 19/14* (2013.01); *H05K 1/14* (2013.01); *H01H 2009/164* (2013.01); *H01H 2219/039* (2013.01); *H01H 2231/012* (2013.01); *H05K 2201/09027* (2013.01); *H05K 2201/10356* (2013.01)

(58) Field of Classification Search
USPC ........................................................ 219/506
See application file for complete search history.

ILLUMINATION SYSTEM OF A COOKING APPLIANCE

CROSS-REFERENCE TO RELATED APPLICATIONS

This application relates to and claims the benefit and priority to European Application No. EP17382640.5, filed Sep. 27, 2017.

TECHNICAL FIELD

The present invention relates to illumination systems of cooking appliances comprising at least one burner and a knob associated with the burner, in which the illumination of an illuminating device associated with the burner or knob for illuminating the knob and/or visually indicating the state of the knob and the burner is controlled.

BACKGROUND

In manually operated cooking appliances, such as a cooktop, for example, a burner is turned on or activated by means of manually operating an associated knob. To turn on a burner, a user turns the corresponding knob from an OFF position, and the power of the burner is regulated depending on the degree of opening of the knob (depending on the angular position of the knob with respect to the OFF position).

Knobs are known to comprise an associated illumination to inform the user that the burner is on, and in some cases to furthermore indicate the power of the burner. Illumination has been provided up until now in two different ways that are described below in a simplified manner. In both cases, the illumination system comprises, associated with the knob, an illuminating device and an activation switch which is closed when the knob is turned from the OFF position.

On one hand, as schematically shown in FIGS. 1a and 1b, there are illumination systems in which there are provided two independent electric circuits C1' and C2' for each knob 201', one for the activation switch 1' and another for the illuminating element 2' (which can be, for example, a LED). This solution is flexible as it allows providing information to the user even when the corresponding burner is inactive (when the activation switch 1' is open), however, it has the drawback of requiring a large number of cables per knob 201' from a corresponding electronic module 4' (in charge at least of feeding the electric circuits C1' and C2'), particularly four: two cables 11' and 12' for the first electric circuit C1' and two cables 21' and 22' for the second electric circuit C2'. This makes it an expensive and difficult-to-implement solution which will become more expensive and complex the more burners the cooking appliance in question comprises (FIG. 1b schematically shows the connection of two knobs 201', corresponding to a cooking appliance with two burners).

On the other hand, in order to solve or prevent this complexity and reduce cost, illumination systems in other solutions comprise a single electric circuit C" for each knob, as schematically shown in FIG. 2. This solution is simple and does not require too much wiring, but it has the drawback of not being able to provide any type of information when the activation switch 1" is open, given that the display device 2" cannot be lit up in those circumstances.

An illumination system with a single electric circuit is disclosed in patent document U.S. Pat. No. 6,733,146 B1. In this illumination system, the activation switch is connected between the power supply and the corresponding display device. The activation switch allows connecting the display device to the power supply only when the knob is not in the OFF position. In this embodiment, the power supply is a battery arranged in the knob itself, so cables are dispensed with.

SUMMARY OF THE DISCLOSURE

The illumination system of the invention is configured for cooking appliances comprising at least one burner, a knob associated with the burner and an electric circuit associated with the knob, the electric circuit comprising a display device that lights up when an electric current with a value equal to or greater than a minimum value circulates therethrough, and activation means which is operated by means of turning the knob. The activation means is arranged in a first electrical branch of the electric circuit and the display device is arranged in a second electrical branch of said electric circuit, both electrical branches being connected in parallel. The knob acts on the activation means causing the voltage drop in the first electrical branch, and therefore in the second electrical branch, to be different when said knob is in an OFF position and when it is in a position other than the OFF position.

The illumination system also comprises an electronic module feeding the electric circuit and comprising a controller monitoring voltage drop in the electrical branches (the voltage drop in both electrical branches is the same, as they are connected in parallel), particularly monitoring the voltage at one of the ends of said electrical branch and reflecting said voltage drop, and controlling the electric current circulating through the display device depending on the result of said monitoring.

Given that the display device and the activation means are arranged in one and the same circuit, two cables must simply be attached to each knob. Additionally, since the display device and the activation means are connected in parallel, the illuminating device can also be lit up when the knob is in the OFF position. In the solutions of the prior art, the activation means comprise a switch which is generally open when the knob is in the OFF position, and in solutions with a single circuit the switch and illuminating device are arranged in series, so the illuminating device cannot be lit up when the knob is in the OFF position.

In the illumination system of the invention, the controller of the electronic module knows whether or not the knob is in the OFF position by means of monitoring said voltage, and depending on the result of said monitoring (whereby detecting whether or not there is a change in voltage drop in the first electrical branch and the value of said voltage drop), controls the current circulating through the illuminating device, causing the illuminating device to turn on or not taking into account whether or not the knob is in the OFF position.

These and other advantages and features will become evident in view of the drawings and detailed description.

DETAILED DESCRIPTION

Figure 1A:
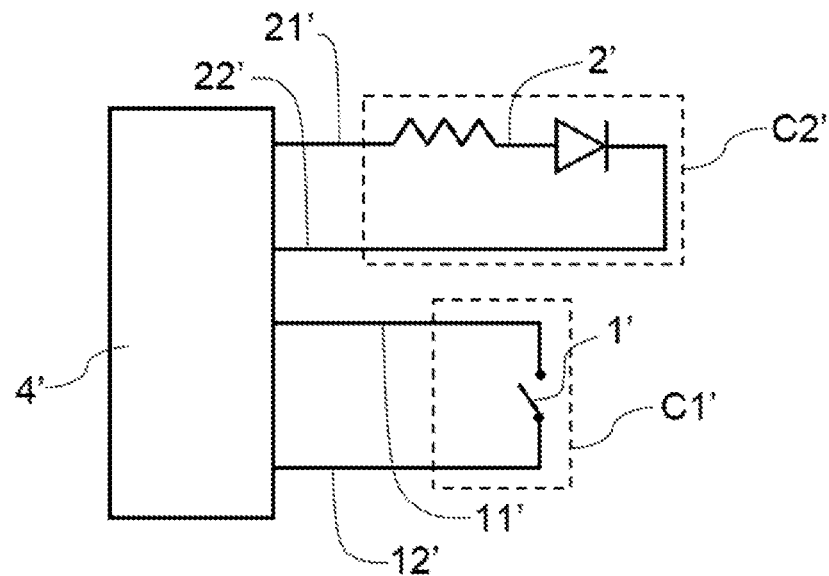
FIG. 1a schematically shows two electric circuits of an illumination system of the prior art, associated with a knob of a cooking appliance.
Figure 1B:
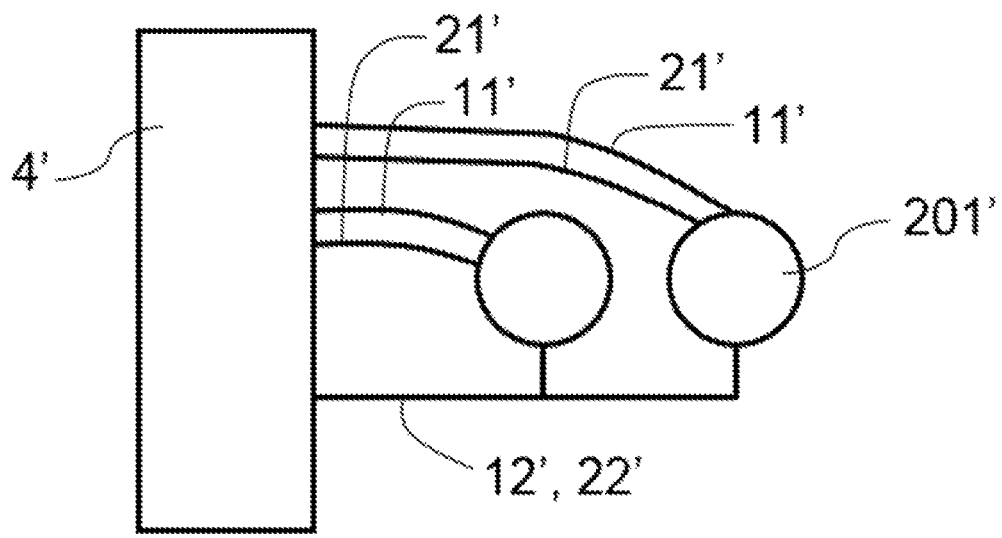
FIG. 1b schematically shows the connection of the system of FIG. 1a in a cooking appliance with two burners.
Figure 2:
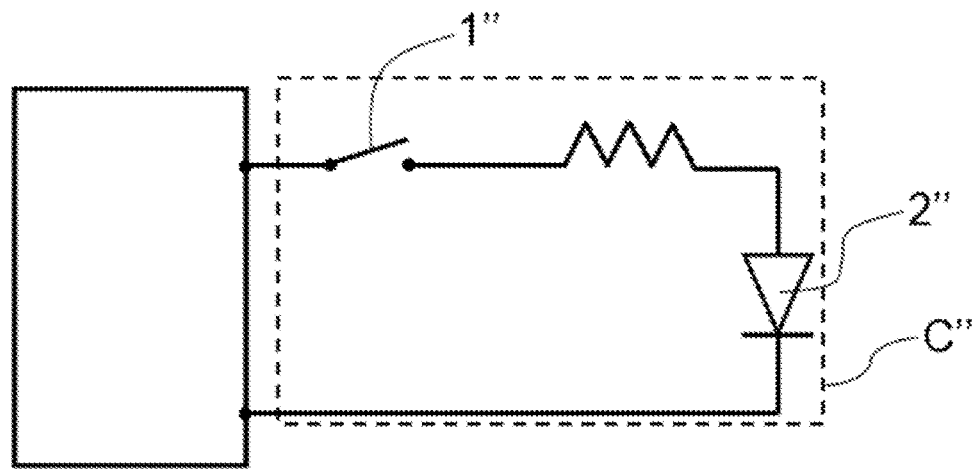
FIG. 2 schematically shows an electric circuit of an illumination system of the prior art, associated with a knob of a cooking appliance.
Figure 3:
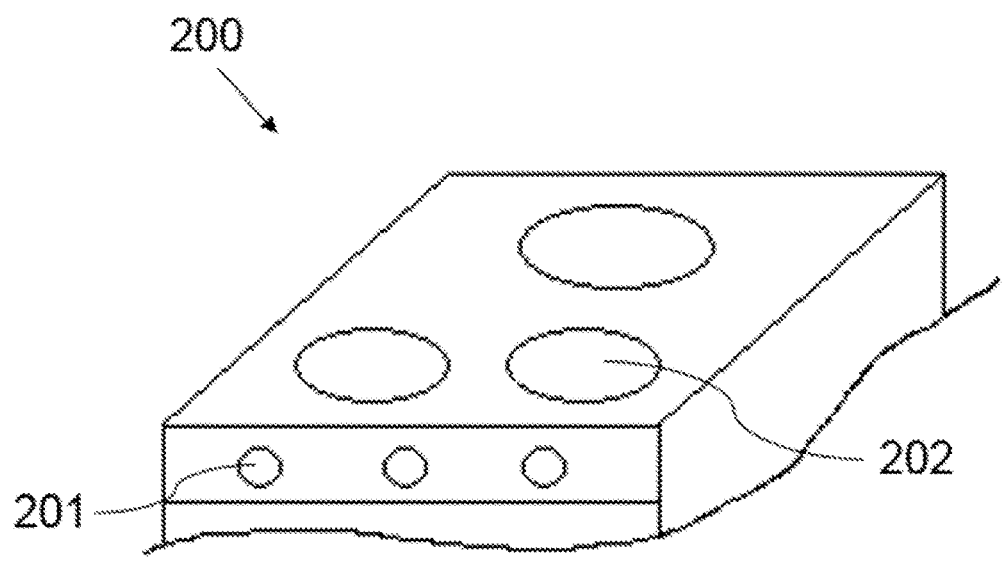
FIG. 3 shows a cooktop with three burners in a simplified manner.

According to some implementations an illumination system is provided that is configured for a cooking appliance which can be a cooktop 200, such as the one shown by way of example in FIG. 3, or any other type of cooking appliance. The cooktop 200 shown in FIG. 3 comprises three burners 202 but may comprise a different number of burners 202, including a single burner 202. Reference is made hereinafter to an illumination system of a cooking appliance comprising three burners 202 by way of example, such as the one shown in the drawings, but this is in no case limiting.

The cooking appliance for which the illumination system is configured comprises at least one knob 201 associated with each burner 202, whereby the corresponding burner 202 is turned on or off and the power of said burner 202 is controlled. To turn on a burner 202, its associated knob 201 is turned from an OFF position to an angular position other than the OFF position (a NON-OFF position), and the power of the burner 202 is adjusted depending on the degree of turning of said knob 201 (depending on the angular position of said knob 201 with respect to the OFF position).

The illumination system comprises an electric circuit C for each burner 202, which is associated with the corresponding knob 201. Therefore, in the case of the cooking appliance shown by way of example in FIG. 3, said illumination system comprises three electric circuits C, one for each burner 202. The illumination system comprises in each electric circuit C a display device 2 that lights up when an electric current I with a value equal to or greater than a minimum value circulates therethrough, and activation means which are operated by means of turning the knob.

The minimum value of the current I required for causing the illuminating device 2 to light up depends on the type of illuminating device 2 used, and it is known beforehand. The display device 2 can comprise a single LED or a plurality of LEDs connected in series and/or in parallel, for example. It could even comprise elements other than a LED with illumination capacity.

Figure 4:
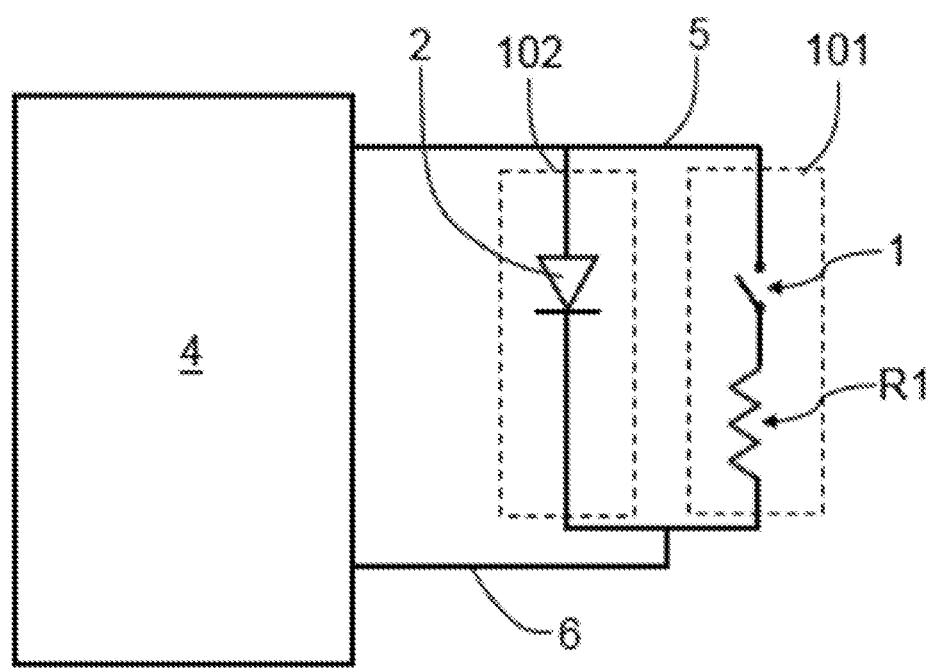
FIG. 4 schematically shows an electric circuit of an illumination system according to one embodiment.

The activation means is arranged in a first electrical branch 101 of the electric circuit C and the display device 2 is arranged in a second electrical branch 102 of said electric circuit C, both electrical branches 101 and 102 being connected in parallel, as shown by way of example in FIG. 4. Acting on the knob 201 causes operation of the activation means, and, with said operation, the activation means causes the voltage drop in the first electrical branch 101 to be different when said knob 201 is in an OFF position and when it is in a position other than the OFF position (a NON-OFF position), given that the impedance of the first electrical branch 101 changes. The voltage drop through the first branch 101 is preferably less when the knob 201 is in a position other than the OFF position.

Figure 5:
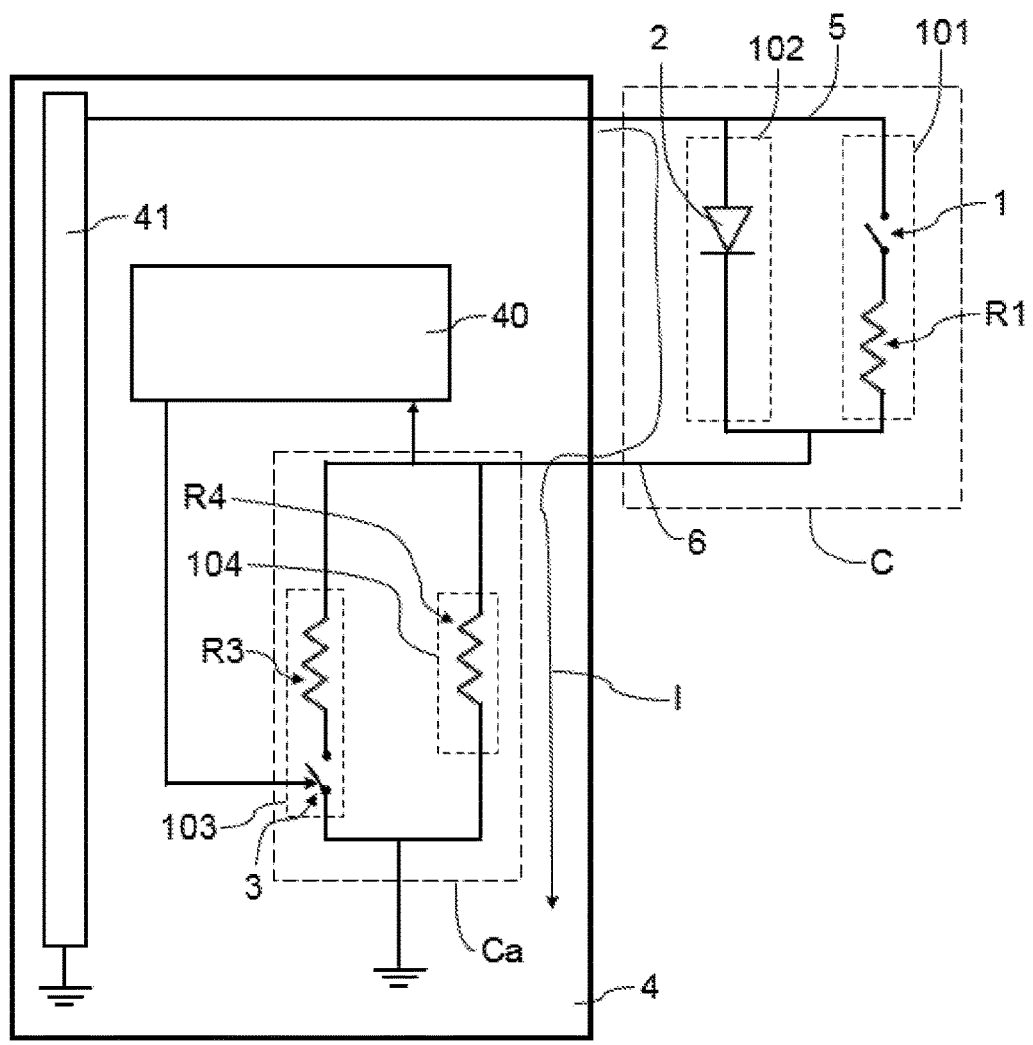
FIG. 5 schematically shows an illumination system according to one embodiment.

The illumination system further comprises an electronic module 4 which feeds all the electric circuits C, preferably by means of a 5V DC power supply 41, for example, and comprises a controller 40, as shown in FIG. 5 for example. The controller 40 is configured to monitor the voltage drop in the first electrical branch 101, particularly to monitor the voltage at one of the ends of said first electrical branch 101 and reflect said voltage drop, and to control the electric current I circulating through the display device 2 depending on said monitoring. For example, if as a result of the monitoring it is detected that the value of the voltage drop (or of the voltage at said end) crosses (exceeds or is below) a given reference threshold, it is detected that it is necessary to cause the illuminating device 2 to light up (or that it is necessary to turn said illumination device off).

Therefore, if it is detected that there is a need to cause the display device 2 to light up, the controller 40 is configured for causing an electric current I with a value sufficient to cause said lighting up to circulate through said display device 2, where the display device 2 can be caused to light up in a controlled manner at all times, and where the desired information can be shown by means of said device at the desired time, regardless of the position of the knob 201 (both if it is in the OFF position and if it is not).

The module 4 is attached to the electric circuit C by means of a first connection 5 through which it feeds the circuit C with a supply voltage V (depending on the power supply 41), and by means of a second connection 6, the two electrical branches 101 and 102 thereby being connected in parallel between said connections 5 and 6. The number of connections required in the illumination system is therefore reduced in comparison with the illumination systems of the prior art which comprise two electric circuits for each knob, while at the same time maintaining the advantages of said systems, given that it is sufficient with said two connections 5 and 6.

The controller 40 is preferably configured to obtain the voltage drop in the first electrical branch 101 by measuring the voltage in said second connection 6 with respect to a given reference point, where it is thereby communicated with said second connection 6. Said second connection 6 is thereby connected to one of the ends of the first branch 101 (and of the second branch 102). Said reference point is preferably ground, where monitoring the voltage drop in the first electrical branch 101 and the voltage in the second connection 6 with respect to the given reference point is equivalent or similar.

Therefore, additional connections do not have to be included in order to monitor the required voltage, where the current I circulating through the illuminating device 2 can be controlled in an easy and simple manner.

Figure 6:
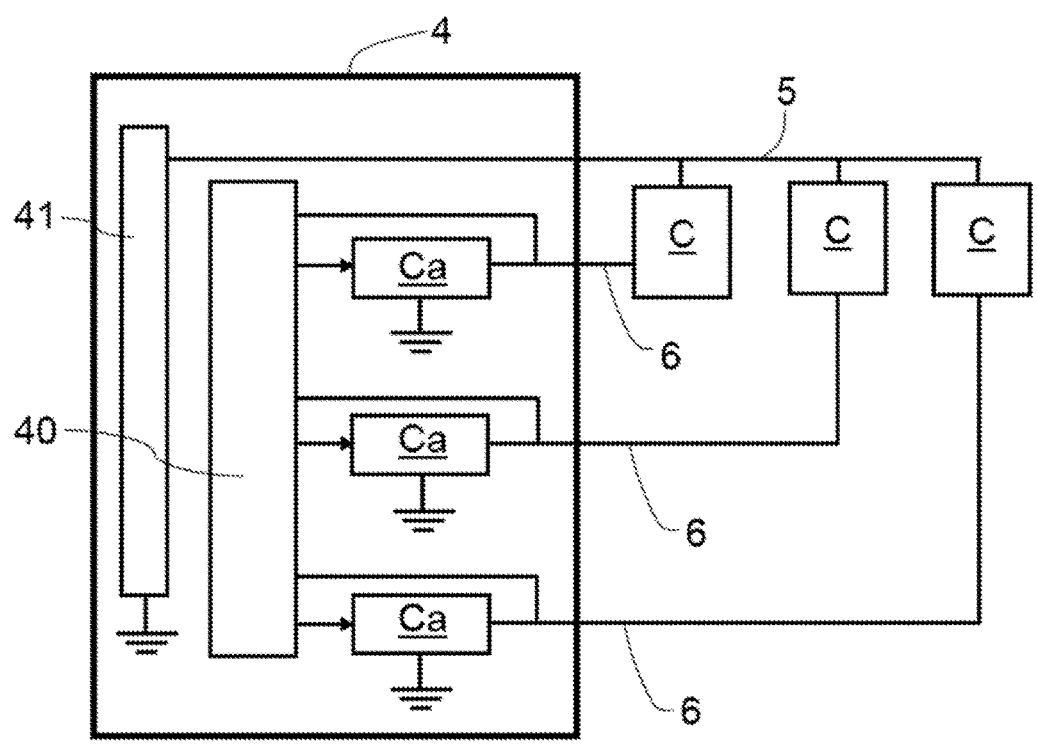
FIG. 6 schematically shows an embodiment of an illumination system according to one embodiment.

As shown in FIG. 6, for example, the illumination system further comprises an additional electric control circuit Ca associated with each burner 202, said additional electric circuit Ca being located in module 4. The additional electric circuit Ca is controlled by the controller 40 and connected in series with the electric circuit C of said burner 202 between the second connection 6 and a reference point, said reference point preferably being ground. For the case of a cooking appliance having three burners 202 like the one in FIG. 3, for example, the illumination system would therefore comprise three electric circuits C and three additional electric circuits Ca, with one electric circuit C and one electric circuit Ca connected in series for each burner 202.

The additional electric circuit Ca comprises a third electrical branch 103 formed by at least one impedance R3 and a control switch 3 connected in series, and a fourth electrical branch 104 which is formed by at least one impedance R4 and is connected in parallel with the third electrical branch 103. The controller 40 is configured to act on said control switch 3 for controlling the electric current I circulating through the display device 2, preferably by means of a two-state pulsating signal, one of the states being used for closing the control switch 3 and keeping it closed, and the other state being used for opening the control switch 3 and keeping it open. Therefore, by means of closing and opening the control switch 3 the current path through the electric circuits C and Ca is changed, making it possible to control the current I going through the illuminating device 2, and the lighting up of said illuminating device 2 thus being controlled.

The relationship of the impedances is such that it assures that the electric current I circulating through the display device 2 is sufficient for said display device 2 to turn on when the control switch 3 is closed, such that the time in which said illuminating device 2 is caused to light up can be controlled in a simple manner by means of the controller 40 (causing the closure of the control switch 3 when required). Therefore, for example, the value of the impedance R4 of the fourth electrical branch 104 of the additional electric circuit Ca is selected so that when the knob 201 is in the OFF position and the control switch 3 is open, the value of the electric current I circulating through the display device 2 is lower than the minimum value, preventing said illuminating device 2 from lighting up, assuring that it only lights up when the controller 40 closes the control switch 3.

The controller 40 is configured to close the control switch 3 when it is detected by means of the monitoring it performs that the knob 201 has transitioned to a position other than the OFF position. In those circumstances, the voltage drop through the first branch 101 changes as described above, where the voltage value in the second connection 6 is thus changed (crossing the reference threshold). This is detected by the controller 40 which, as a response to this change in position of the knob 201, causes the closure of the control switch 3.

Once the controller 40 causes the closure of the control switch 3 as a response to the transition of the knob 201 from the OFF position to a different position, said controller 40 is furthermore configured to perform a verification process whereby it detects the time in which the knob 201 transitions back to the OFF position, in a simple manner and without having to add additional elements and connections to that end. With the control switch 3 thus closed, the controller 40 is configured to open said control switch 3 after a given time interval, and to monitor the corresponding voltage in order to detect if the reference threshold has been crossed in the opposite direction (indicating that the knob 201 has transitioned to the OFF position), said control switch 3 thus being open. If a crossing is not detected, i.e., if the knob 201 is kept in its actual state (in this case in a position other than the OFF position), the controller 40 again closes the control switch 3 for the corresponding time interval. This process is cyclically repeated until detecting that the reference threshold has been crossed, at which time the controller 40 detects that the knob 201 has transitioned to the OFF position. The time intervals during this process in which the control switch 3 is closed and open can be configured depending on user and/or manufacturer requirements, where, for example, it may so happen that a user is not aware that this process is being carried out, i.e., while the process is being carried out, the illuminating device 2 still lights up and the user is not aware of any change in the device, or of the illuminating device 2 blinking in a given manner.

When the controller 40 detects the transition of the knob 201 to the OFF position by means of the corresponding monitoring (the reference threshold is crossed), the controller 40 can be configured to identify residual heat in the corresponding burner 202, if and as required. For example, the controller 40 can show the information on a display, in which case the control switch 3 would be open to turn off the illuminating device 2, or it can show information through the display device 2. In this latter case, said controller 40 can be configured to close the control switch 3 and keep it closed for a given time interval, and to open it once said time interval has elapsed, for example, or it can be configured to cause said illuminating element 2 to light up intermittently for a given time interval by opening and closing the control switch 3 during said time interval to cite two examples.

The activation means preferably comprise an activation switch 1 which is open with the knob in the OFF position and closed with the knob 201 in another position, the first electrical branch 101 further comprising in this case an impedance R1 connected in series with the activation switch (see the figures). In other embodiments, the activation means comprise a potentiometer the impedance of which changes with the angular position of the knob 201, preferably having the highest resistive impedance with the knob 201 in the OFF position.

Figure 7:
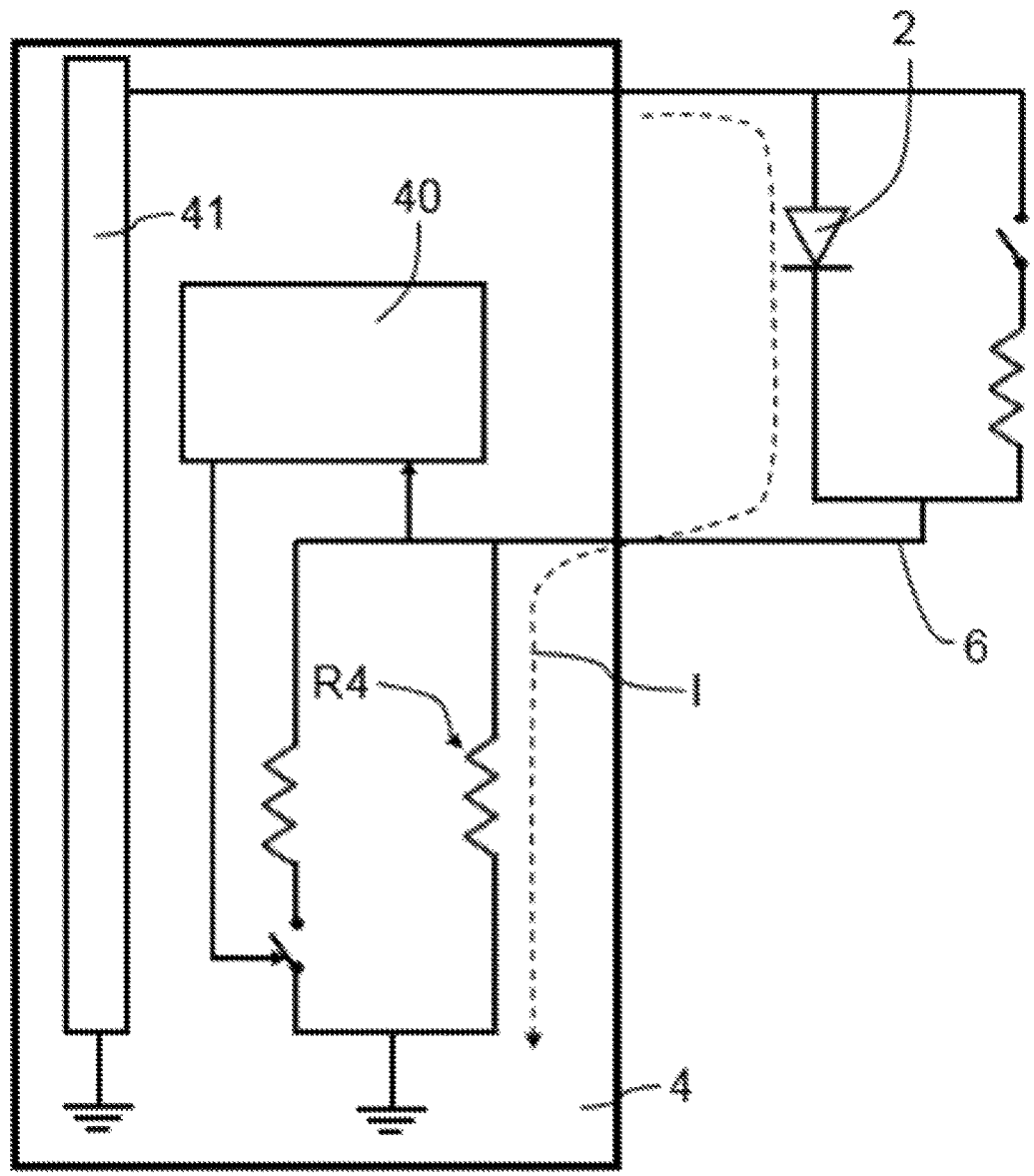
FIG. 7 shows the predominant path of the electric current through the electric circuits of FIG. 5, with the two switches open.
Figure 8:
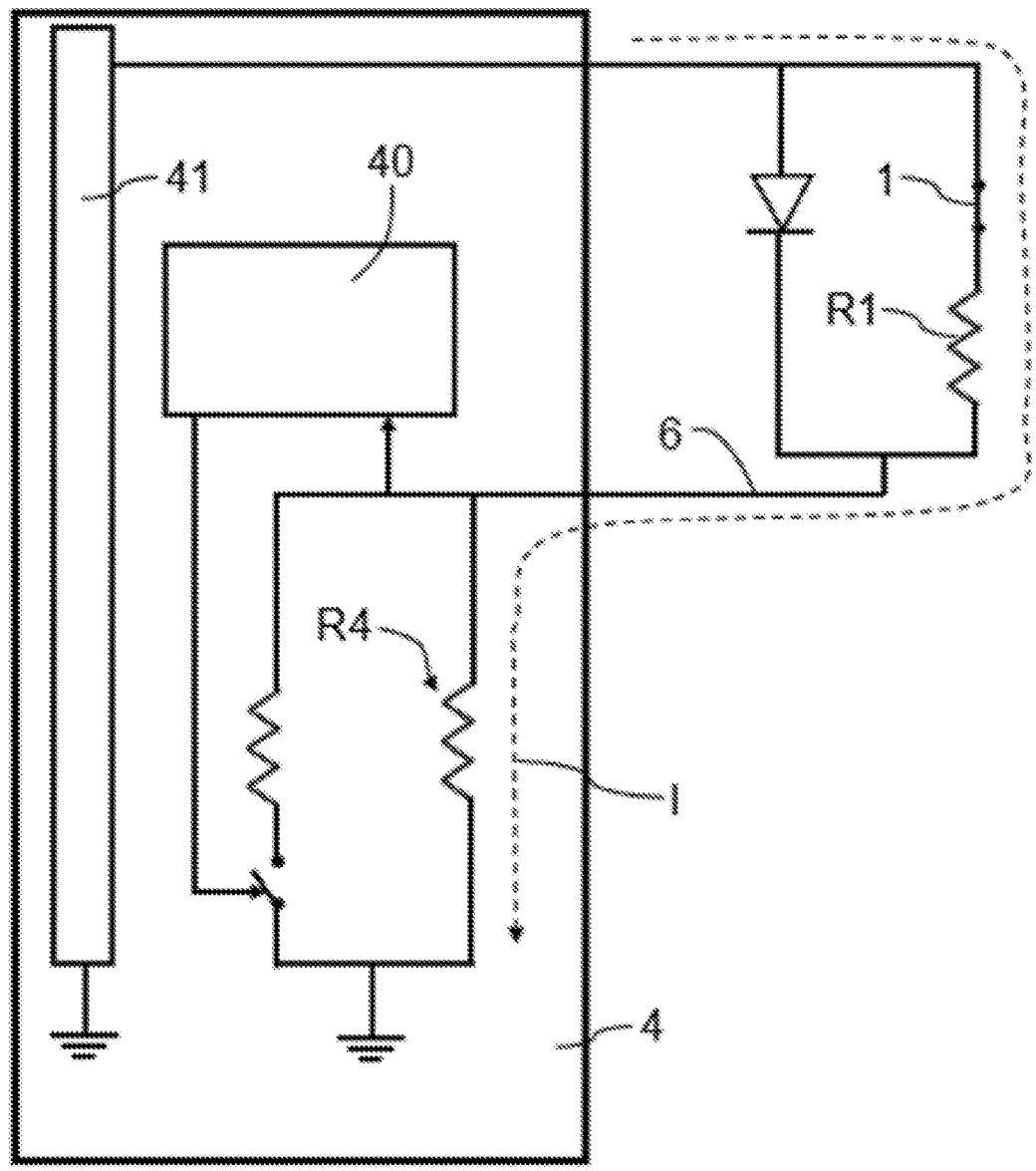
FIG. 8 shows the predominant path of the electric current through the electric circuits of FIG. 5, with the switch associated with the corresponding knob closed and with the control switch open.
Figure 9:
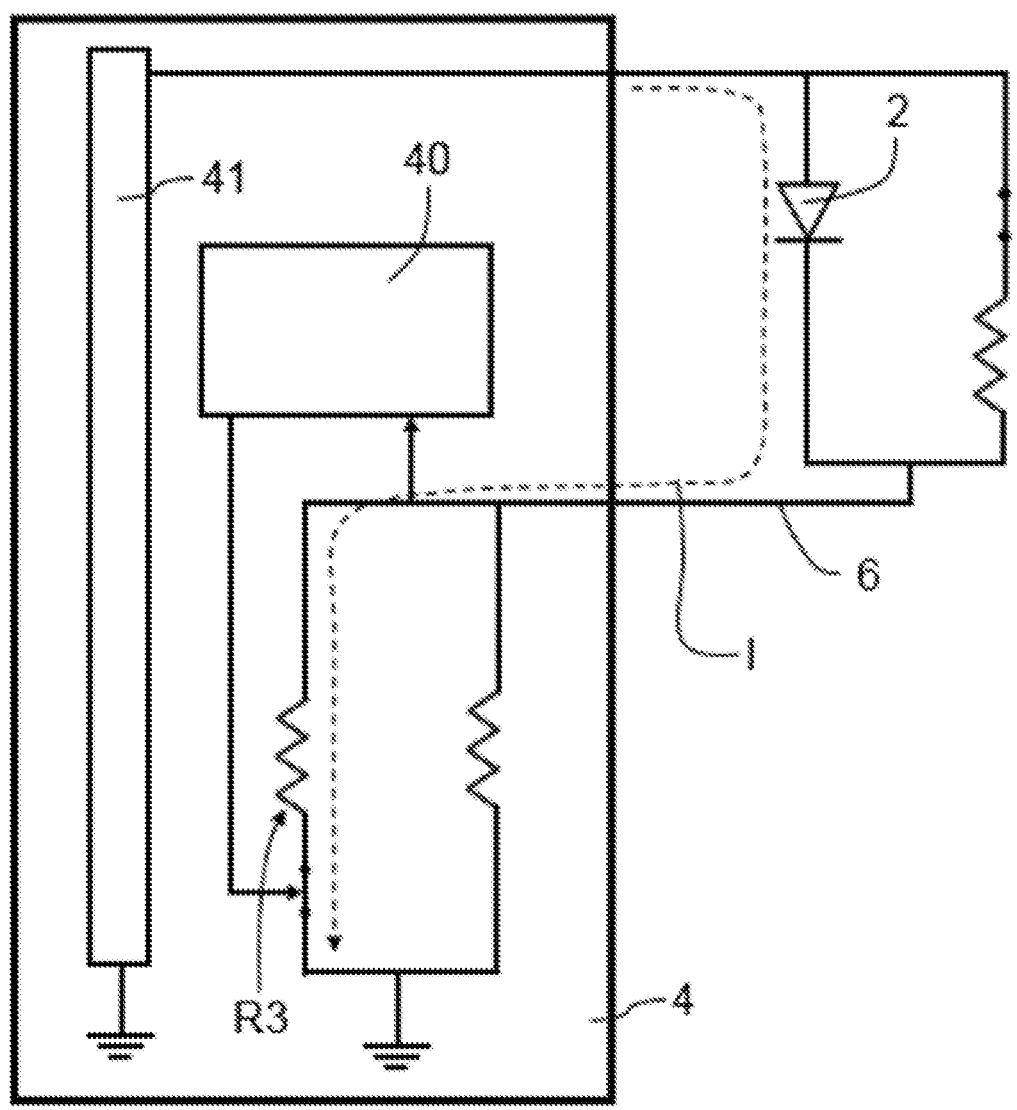
FIG. 9 shows the predominant path of the electric current through the electric circuits of FIG. 5, with both switches closed.

The operation of the illumination system is explained below with an example relating to a burner 202 and a first electrical branch comprising an activation switch 1 (activation means) and an impedance R1 arranged in series, and in reference to FIGS. 7 to 9:

In an initial state in which the burner 202 is turned off (and therefore the associated knob 201 is in the OFF position), switches 1 and 3 are open. In this initial state, the electric current I circulates through the display device 2 and through the impedance R4 (FIG. 7). As described above, the value of the impedance R4 is selected taking into account that the illuminating device 2 does not light up in this situation (control switch 3 open).

When the knob 201 is acted on and is caused to transition to a position other than the OFF position, the activation switch 1 responds by closing, and therefore in this circumstance the activation switch 1 is closed and the control switch 3 remains open. In this state, the electric current I in the electric circuit C predominantly circulates through the activation switch 1 (a negligible electric current circulates through the display device 2, if current is even circulating) and the electric current I in the additional electric circuit Ca circulates through the impedance R4 (FIG. 8), so the illuminating device 2 is still turned off. The values of the different impedances are related to one another such that in this situation, a crossing of the reference threshold is detected with the monitoring. Particularly, if the voltage in the second connection 6 with respect to the ground is monitored, for example, the value of said voltage will be greater in this situation than in the situation in which both switches 1 and 3 are open (FIG. 7), crossing the reference threshold so as to exceed it. The reference threshold can be the voltage value with both switches 1 and 3 open, or an intermediate value between said voltage and the minimum possible voltage when the activation switch 1 is closed and the control switch 3 is open. This crossing is detected by the controller 40, which will act accordingly.

When the crossing of the reference threshold so as to exceed it is detected, the controller 40 causes the closure of the control switch 3 so that the illuminating device 2 lights up and visually indicates that the corresponding burner 202 is turned on. The value of the impedance R3 is selected so that it is substantially less than the value of the impedance R4, such that with the control switch 3 closed, most of the electric current I circulating through the additional electric circuit Ca does so through the impedance R3 (a negligible electric current circulates through the impedance R4), and with a value greater than the minimum value to cause the corresponding display device 2 to light up. Furthermore, the value of the impedance R1 and the corresponding impedance R3 are related to one another such that when both switches 1 and 3 are closed, the electric current I circulating through the illuminating device 2 causes said device to light up. In these circumstances (with both switches 1 and 3 closed), the electric current I in the electric circuit C preferably circulates predominantly through the display device 2 (an electric current which may be negligible circulates through the activation switch 1), or at least through said display device 2 with a value equal to or greater than the minimum value required to cause the device to light up, and the electric current I in the additional electric circuit Ca circulates through the impedance R3 (a negligible electric current circulates through the impedance R4), see FIG. 9.

This explanation would be similar to the equivalent explanation for the case in which the activation means comprise a potentiometer. In this case, the potentiometer is selected so that it complies with the requirements that the first electrical branch 101 complies with in the embodiments in which it comprises an activation switch 1 and an impedance R1.

Figure 10:
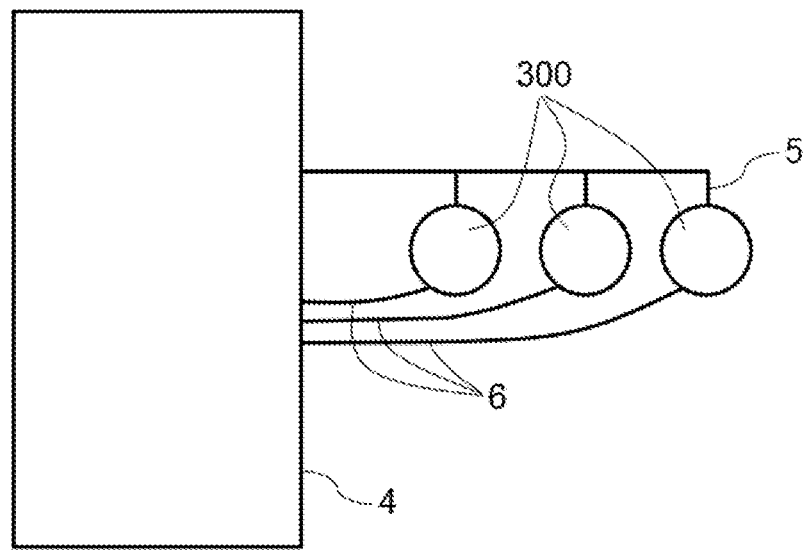
FIG. 10 schematically shows the connection of an embodiment of the illumination system of the invention in the cooktop of FIG. 3.
Figure 11A:
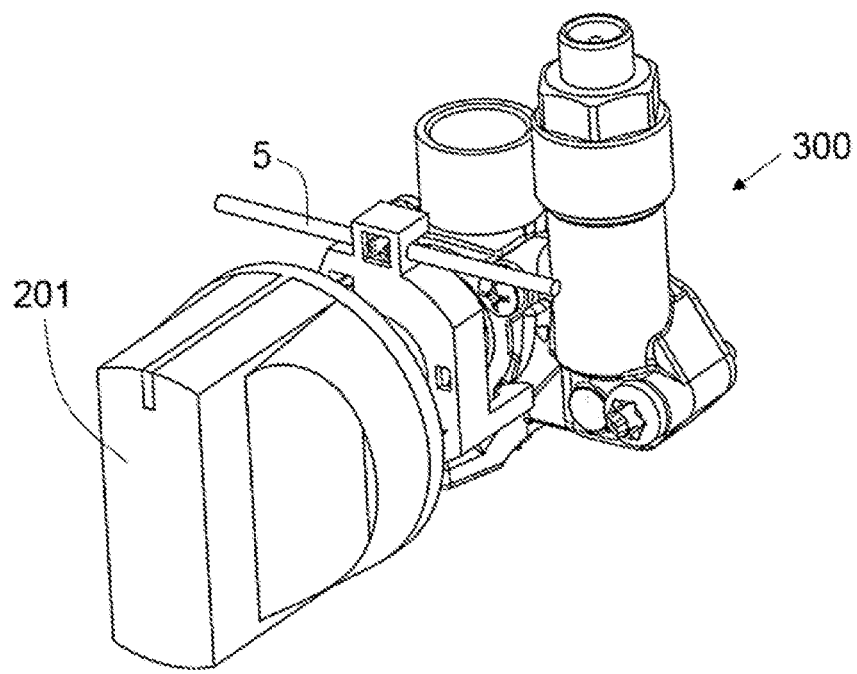
FIG. 11a shows an assembly which comprises a knob and is connected to the connections of the illumination system of the invention.
Figure 11B:
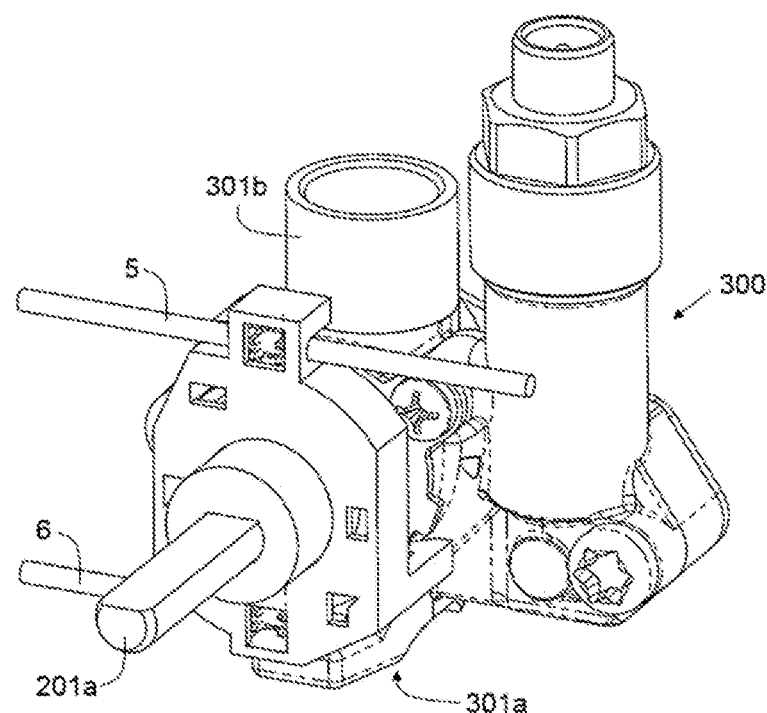
FIG. 11b shows the assembly of FIG. 11a, but without knob.

Each knob 201 is part of a respective assembly 300 in the cooking appliance, and each assembly 300 is connected to the module 4 by means of connections 5 and 6, as shown schematically by way of example in FIG. 10 (for the case of the cooktop 200 of FIG. 3). For the case of a gas cooking appliance, the assembly 300 comprises a gas valve, in addition to the knob 201, a gas inlet 301a, a gas outlet 301b that is connected to the corresponding burner 202 and a rotating shaft 201a for the knob 201, as shown by way of example in FIGS. 11a and 11b.

Figure 12:
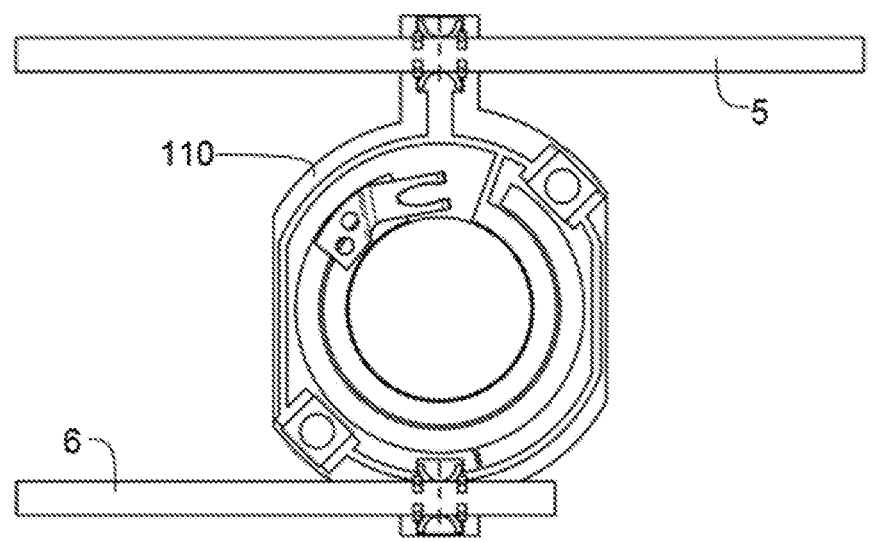
FIG. 12 shows a first printed circuit board of the illumination system of FIG. 5 for a burner of a cooking appliance, said board being connected to the connections of said illumination system.

The illumination system preferably comprises a first printed circuit board 110 where the electric circuit C shown by way of example in FIG. 12 is arranged, and said first printed circuit board 110 is arranged in an assembly 300 of which the corresponding knob 201 is part. The first printed circuit board 110 preferably comprises a circular shape with the knob 201 surrounding it. The additional electric circuits Ca are part of the module 4, as shown in the figures, and the illumination system further comprises a second printed circuit board not shown in the figures, where said module 4 is arranged. The second printed circuit board is spaced apart from the first printed circuit board 110, and therefore from the knobs 201 (and the corresponding assemblies 300), where they are attached to one another by cables which are connections 5 and 6.

Said impedances R1, R3 and R4 of the electric circuits C and Ca preferably comprise resistances (e.g. resistors), but may, for example, also comprise capacitors, coils or a combination of any of the aforementioned elements.

What is claimed is:

1. An illumination system of a cooking appliance having a burner and a knob associated with the burner that rotates between an OFF position and a NON-OFF position, the OFF position corresponding to the burner being off, the NON-OFF position corresponding to the burner being on, the illumination system comprising;
    an electric circuit associated with the knob, the electrical circuit comprising:
        a first connection through which a supply voltage is fed to the electric circuit;
        a second connection coupled to a reference point;
        a first electrical branch that is electrically disposed between the first and second connections, the first electrical branch including activation means that is operably coupled to the knob and configured to alter a voltage drop in the first electrical branch when the knob transitions from the OFF position to the NON-OFF position;
        a second electrical branch that is electrically disposed between the first and second connections, the second electrical branch including a display device and being electrically connected in parallel to the first electrical branch, the display device being configured to illuminate when an electric current having a value equal to or greater than a minimum value circulates through the display device;
    a control module that is configured to monitored the voltage drop in the first electrical branch and to control an electric current circulating through the display device depending on the monitored voltage drop.

2. The illumination system according to claim 1, wherein the reference point is a ground.

3. The Illumination system according to claim 1, wherein the control module is configured to obtain the voltage drop in the first electrical branch by measuring a voltage in the second connection.

4. The illumination system according to claim 3, wherein the control module comprises an electric control circuit associated with the burner and a controller, the electric control circuit being controlled by the controller, the electric control circuit being connected in series with the electric circuit between the second connection of the illumination system and the reference point.

5. The illumination system according to claim 4, wherein the electric control circuit comprises a third electrical branch and a fourth electrical branch, the third electrical branch including at least one impedance element and a control switch connected in series, the fourth electrical branch including at least one impedance element and being connected in parallel with the third electrical branch, the controller being configured to act on the control switch to control the electric current circulating through the display device, the at least one impedance element of the third electrical branch and the at least one impedance element of the fourth electrical branch being selected such that when the control switch is closed the electric current circulating through the display device is equal to or greater than the minimum value.

6. The illumination system according to claim 5, wherein the controller is configured to close the control switch to turn on the display device and subsequently opening the control switch in order to monitor the voltage drop in the first electrical branch.

7. The illumination system according to claim 6, wherein the controller is configured to cyclically open and close the control switch, and to terminate the cyclically opening and closing of the control switch when the knob is placed in the OFF position.

8. The illumination system according to claim 7, wherein a time in which the control switch is open and/or a time in which the control switch is closed is adjustable.

9. The illumination system according to claim 7, wherein the controller is configured to detect a transition of the rotating knob from the NON-OFF position to the OFF position by means of monitoring the voltage drop in the first electrical branch, the controller being configured to close the control switch for a given time interval or to cyclically close and open the control switch for a given time interval.

10. The illumination system according to claim 5, wherein a value of impedance of the fourth electrical branch of the electric control circuit is selected so that when the knob is in the OFF position and the control switch is open, the value of the electric current circulating through the display device is lower than the minimum value.

11. The illumination system according to claim 5, wherein the controller is configured to act on the control switch with a pulsating digital signal.

12. The illumination system according to any of claims 5, wherein the electric circuit resides in a first printed circuit board and the controller and electric control circuit resides in a second printed circuit board, the first and second printed circuit boards being electrically coupled by first and second electrical cables that respectively form at least in part the first connection and the second connection.

13. The illumination system according to claim 12, wherein the first and second printed circuit boards are electrically coupled by only the first and second electrical cables.

14. The illumination device according to claim 12, wherein the knob comprises a part of an assembly that is attached to the cooking appliance, the first printed circuit board being arranged in the assembly.

15. The illumination system according to claim 14, wherein the assembly is a gas valve that includes a gas inlet, a gas outlet that is fluidly connected to the burner and a rotating shaft to which the knob is attached.

16. The illumination system according to claim 5, wherein each of the impedance elements in the third and fourth electrical branchs of the electrical control circuit comprises a resistor.

17. The illumination system according to claim 1, wherein the activation means comprises an activation switch, the activation switch being open when the knob is in the OFF position, the activation switch being closed when the rotating knob is in the NON-OFF position.

18. The illumination system according to claim 17, wherein the first electrical branch of the electric circuit includes the activation switch and an impedance element arranged in series with the activation switch.

19. The illumination system according to claim 18, wherein the impedance element of the first electrical branch comprises a resistor.

20. The illumination system according to claim 1, wherein the activation means comprises a potentiometer.

\* \* \* \* \*